(12) United States Patent
Pai

(10) Patent No.: US 12,308,832 B2
(45) Date of Patent: May 20, 2025

(54) RADIO FREQUENCY SWITCH CIRCUIT

(71) Applicant: RichWave Technology Corp., Taipei (TW)

(72) Inventor: Ching-Yao Pai, Taipei (TW)

(73) Assignee: RichWave Technology Corp., Taipei (TW)

( * ) Notice: Subject to any disclaimer, the term of this patent is extended or adjusted under 35 U.S.C. 154(b) by 43 days.

(21) Appl. No.: 18/330,380

(22) Filed: Jun. 7, 2023

(65) Prior Publication Data
US 2024/0305294 A1  Sep. 12, 2024

(30) Foreign Application Priority Data
Mar. 8, 2023  (TW) .................................. 112108596

(51) Int. Cl.
*H03K 17/693* (2006.01)
*H03K 17/16* (2006.01)
*H03K 19/003* (2006.01)

(52) U.S. Cl.
CPC ......... *H03K 17/693* (2013.01); *H03K 17/162* (2013.01); *H03K 19/00361* (2013.01)

(58) Field of Classification Search
CPC .................................................... H03K 17/693
USPC ......................................................... 327/408
See application file for complete search history.

(56) References Cited

U.S. PATENT DOCUMENTS

| | | | |
|---|---|---|---|
| 2013/0072134 A1* | 3/2013 | Goto | H04B 1/109 |
| | | | 333/101 |
| 2015/0130557 A1 | 5/2015 | Ranta et al. | |
| 2017/0373680 A1 | 12/2017 | Bakalski | |
| 2018/0131369 A1 | 5/2018 | Popplewell et al. | |

FOREIGN PATENT DOCUMENTS

EP          3069446          1/2023

OTHER PUBLICATIONS

"Office Action of Taiwan Counterpart Application", issued on Sep. 19, 2023, p. 1-p. 12.
"Search Report of Europe Counterpart Application", issued on Jul. 16, 2024, p. 1-p. 7.

* cited by examiner

*Primary Examiner* — Tomi Skibinski
(74) *Attorney, Agent, or Firm* — JCIPRNET

(57) ABSTRACT

A radio frequency switch circuit includes a series circuit. The series circuit includes a first series connection group and a second series connection group. The first series connection group includes a plurality of first transistors. The second series connection group includes a plurality of second transistors. Control terminals of the first transistors are all coupled to a first control node. Control terminals of the second transistors are all coupled to a second control node. When an electrostatic discharge event occurs, a voltage at the first control node is different from a voltage at the second control node. In a normal operation state, a switch state of the first series connection group and a switch state of the second series connection group are the same as each other.

18 Claims, 5 Drawing Sheets

Related Art

RADIO FREQUENCY SWITCH CIRCUIT

CROSS-REFERENCE TO RELATED APPLICATION

This application claims the priority benefit of Taiwanese application no. 112108596, filed on Mar. 8, 2023. The entirety of the above-mentioned patent application is hereby incorporated by reference herein and made a part of this specification.

BACKGROUND

Technical Field

The disclosure relates to a switch circuit. Particularly, the disclosure relates to a radio frequency switch circuit.

Description of Related Art

FIG. 1 is a schematic diagram of a series circuit currently used in a radio frequency switch circuit. A series circuit 10 is disposed between a first end and a second end of a transmission path P. The series circuit 10 includes transistors T1 to T8. The transistors T1 to T8 are coupled in series to each other. Control terminals (i.e., gates) of the transistors T1 to T8 are commonly coupled through an impedance and commonly receive the same control signal. As a result, the series circuit 10 may turn off or turn on the transmission path P according to the control signal.

However, when an electrostatic discharge (ESD) event occurs at one end of the series circuit 10, an ESD voltage VESD or an ESD current with an ESD energy is generated. Taking the ESD voltage VESD with an ESD energy as an example, the ESD voltage VESD may be coupled to the control terminals of the transistors T1 to T8 through the parasitic capacitance of the transistor T1. It should be noted that the control terminals of the transistors T1 to T8 are commonly coupled through an impedance and receive the same ESD voltage VESD. As a result, the sources of the transistors T1 to T8 have different voltages based on voltage division of the transistors T1 to T8. The switching voltages of the transistors T1 to T8 are all different. In other words, the voltage differences (VGS) between the gates and the sources of the transistors T1 to T8 are all different.

For example, when the ESD voltage VESD has a peak voltage equal to 100 volts (V), the voltage at the first terminal of the transistor T1 is equal to 100 V, the voltage at the second terminal of the transistor T1 is equal to 87.5 V, and the voltage at the control terminal of the transistor T1 is equal to 100 V. As a result, the switching voltage of the transistor T1 is equal to 12.5 V. The voltage at the second terminal of the transistor T2 is equal to 75 V. The switching voltage of the transistor T2 is equal to 25 V. The voltage at the second terminal of the transistor T3 is equal to 62.5 V. The switching voltage of the transistor T3 is equal to 37.5 V. Similarly, the switching voltage of the transistor T8 is equal to 100 V.

Based on the foregoing, as the number of transistors T1 to T8 increases, the difference between the switching voltage of the transistor T1 (which is closest to the place where the ESD occurs) and the switching voltage of the transistor T8 (which is farthest from the place where the ESD occurs) increases. The transistors T1 to T8 cannot respond to the voltage transient changes of ESD, resulting in different switching operations. As a result, the capability of dissipating ESD is adversely affected.

SUMMARY

The disclosure provides a radio frequency switch circuit, which can improve the capability of dissipating electrostatic discharge (ESD).

According to an embodiment of the disclosure, a radio frequency switch circuit includes a series circuit. The series circuit includes a first series connection group and a second series connection group. The first series connection group includes a plurality of first transistors. The second series connection group includes a plurality of second transistors. Control terminals of the plurality of first transistors are all coupled to a first control node. Control terminals of the plurality of second transistors are all coupled to a second control node. When an electrostatic discharge event occurs, a voltage at the first control node is different from a voltage at the second control node. In a normal operation state, a switch state of the first series connection group and a switch state of the second series connection group are the same as each other.

According to an embodiment of the disclosure, a radio frequency switch circuit includes a radio frequency input terminal, a radio frequency output terminal, and a series circuit. The radio frequency output terminal has a first transmission path with the radio frequency input terminal. A first terminal of the series circuit is coupled to the first transmission path. A second terminal of the series circuit is coupled to a reference voltage end. The series circuit includes a first series connection group and a second series connection group. The first series connection group includes a plurality of first transistors. The second series connection group includes a plurality of second transistors. A terminal of the second series connection group is coupled to the reference voltage end. In a normal operation state, a switch state of the first series connection group and a switch state of the second series connection group are the same as each other.

According to an embodiment of the disclosure, a radio frequency switch circuit includes a series circuit. The series circuit includes a first series connection group and a second series connection group. The first series connection group includes a plurality of first transistors. The second series connection group includes a plurality of second transistors. Control terminals of the plurality of first transistors are all coupled to a first control node. Control terminals of the plurality of second transistors are all coupled to a second control node. When an electrostatic discharge event occurs, a voltage at the first control node is different from a voltage at the second control node.

Based on the foregoing, the series circuit includes the first series connection group and the second series connection group. The control terminals of the plurality of first transistors of the first series connection group are all coupled to the first control node. The control terminals of the plurality of second transistors of the second series connection group are all coupled to the second control node. When an ESD event occurs, the voltage at the first control node is different from the voltage at the second control node. When an ESD event occurs, the switching voltages (the voltage differences between the gates and the sources) of the plurality of first transistors and the plurality of second transistors are relatively close. In this way, the radio frequency switch circuit can improve the capability of dissipating ESD.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
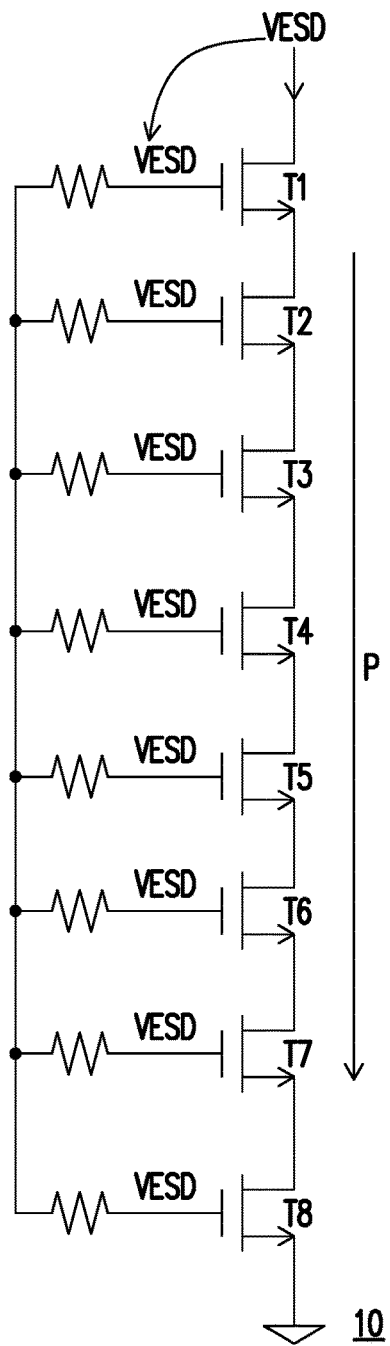
FIG. 1 is a schematic diagram of a series circuit currently used in a radio frequency switch circuit.

Part of embodiments of the disclosure accompanied with the drawings will be described in detail. The same reference numerals when used in the following description and in different drawings will be regarded as referring to the same or similar elements. These embodiments are only part of the disclosure, and do not disclose all the possible implementations of the disclosure. More precisely, these embodiments are just examples of the scope of the disclosure's patent application.

Figure 2:
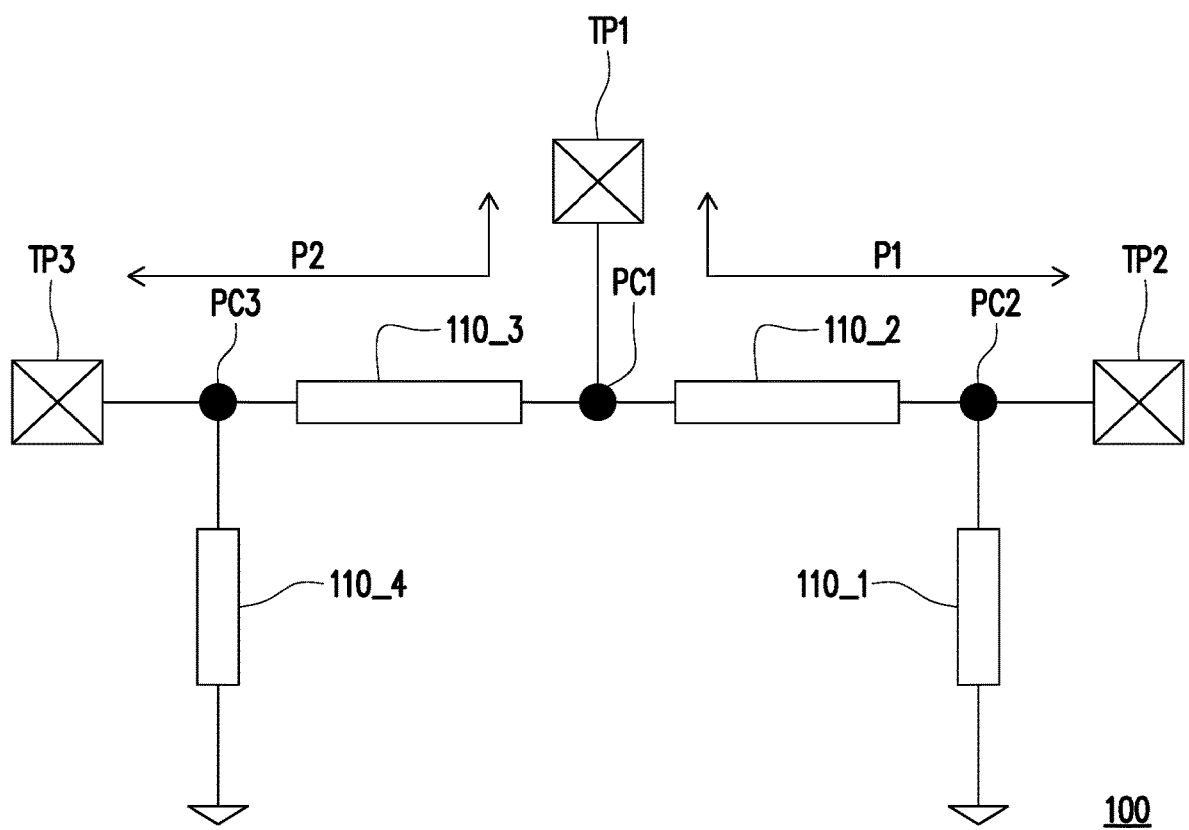
FIG. 2 is a schematic diagram of a radio frequency switch circuit according to an embodiment of the disclosure.

With reference to FIG. 2, FIG. 2 is a schematic diagram of a radio frequency switch circuit according to an embodiment of the disclosure. In this embodiment, a radio frequency switch circuit 100 includes transmitting terminals TP1, TP2, and TP3 and series circuits 110_1, 110_2, 110_3, and 110_4. The transmitting terminal TP1 is coupled to a common node PC1. The transmitting terminal TP2 is coupled to a common node PC2. The transmitting terminal TP3 is coupled to a common node PC3. The series circuit 110_1 is coupled between the common node PC2 and a reference voltage end. The reference voltage end may be grounded or receive a low reference voltage. The voltage at the reference voltage end is equal to 0 V, for example. The series circuit 110_2 is coupled between the common node PC1 and the common node PC2. The series circuit 110_3 is coupled between the common node PC1 and the common node PC3. The series circuit 110_4 is coupled between the common node PC3 and a reference voltage end. In this embodiment, the transmitting terminals TP1, TP2, and TP3 are configured to receive or send a radio frequency signal. The transmitting terminals TP1, TP2, and TP3 may each be a pad or a pin. For example, the transmitting terminal TP1 may serve as a radio frequency input terminal. One of the transmitting terminals TP2 and TP3 may serve as a radio frequency output terminal. There is a transmission path P1 between the transmitting terminals TP1 and TP2. There is a transmission path P2 between the transmitting terminals TP1 and TP3.

In this embodiment, in a normal operation state, the radio frequency switch circuit 100 may cause the series circuits 110_1 and 110_3 to be in a turned-off state and turn on the series circuits 110_2 and 110_4. As a result, the transmitting terminal TP2 forms the transmission path P1 with the transmitting terminal TP1 through the common nodes PC2 and PC1. Alternatively, the radio frequency switch circuit 100 may cause the series circuits 110_2 and 110_4 to be in a turned-off state and turn on the series circuits 110_1 and 110_3. As a result, the transmitting terminal TP3 forms the transmission path P2 with the transmitting terminal TP1 through the common nodes PC3 and PC1.

In this embodiment, the radio frequency switch circuit 100 may utilize a control signal to cause the series circuits 110_1, 110_2, 110_3, and 110_4 to be in one of a turned-off state and a turned-on state.

In some embodiments, the radio frequency switch circuit 100 includes the transmitting terminals TP1 and TP2 and the series circuits 110_1 and 110_2. The implementation aspects of the radio frequency switch circuit of the disclosure are not limited to this embodiment.

Figure 3:
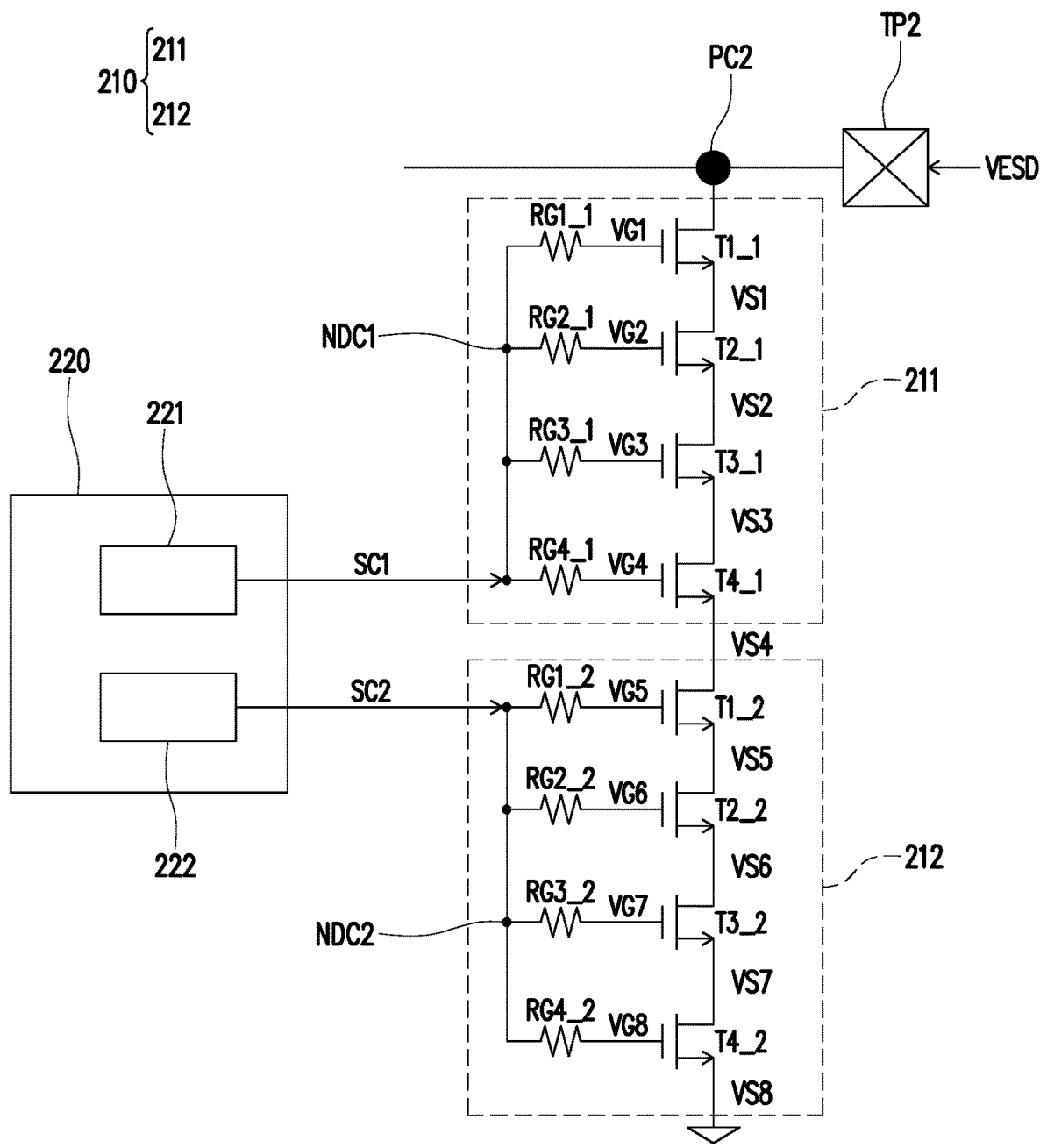
FIG. 3 is a schematic diagram of a series circuit according to an embodiment of the disclosure.

With reference to FIG. 3, FIG. 3 is a schematic diagram of a series circuit according to an embodiment of the disclosure. In this embodiment, a series circuit 210 is taken to implement one of the series circuits 110_1 to 110_4 as shown in FIG. 2, for example. Taking this embodiment as an example, the first terminal of the series circuit 210 is coupled to a common node PC2. The second terminal of the series circuit 210 is coupled to a reference voltage end. In some embodiments, the first terminal of the series circuit 210 is coupled to the common node PC2, and the second terminal of the series circuit 210 is coupled to a common node PC1, as shown in FIG. 2.

In this embodiment, the series circuit 210 includes series connection groups 211 and 212. The series connection groups 211 and 212 are coupled in series to each other. The series connection group 211 includes transistors T1_1 to T4_1. The transistors T1_1 to T4_1 are coupled in series to each other. For example, the first terminal of the transistor T1_1 is coupled to the common node PC2, the first terminal of the transistor T2_1 is coupled to the second terminal of the transistor T1_1, the first terminal of the transistor T3_1 is coupled to the second terminal of the transistor T2_1, and so on. The series connection group 212 includes transistors T1_2 to T4_2. The transistors T1_2 to T4_2 are coupled in series to each other. For example, the first terminal of the transistor T1_2 is coupled to the second terminal of the transistor T1_4, the first terminal of the transistor T2_2 is coupled to the second terminal of the transistor T1_2, and so on. In this embodiment, control terminals of the transistors T1_1 to T4_1 are all coupled to a control node NDC1. Control terminals of the transistors T1_2 to T4_2 are all coupled to a control node NDC2.

In this embodiment, the transistors T1_1 to T4_1 and T1_2 to T4_2 are implemented by N-type transistors. The transistors T1_1 to T4_1 and T1_2 to T4_2 are N-type MOSFETs, for example. The transistors T1_1 to T4_1 and T1_2 to T4_2 have the same design size (for example, the same channel width to length ratio). As a result, the series connection groups 211 and 212 have the same design size, but the disclosure is not limited thereto. In some embodiments, the transistors T1_1 to T4_1 and T1_2 to T4_2 may have similar but different design sizes, as long as the design size of the transistors T1_1 to T4_1 and T1_2 to T4_2 meet the standard size or design tolerance. In addition, in some embodiments, the transistors T1_1 to T4_1 and T1_2 to T4_2 are implemented by P-type transistors. The transistors T1_1 to T4_1 and T1_2 to T4_2 are P-type MOSFETs, for example.

In a normal operation state, a switch state of the series connection group 211 and a switch state of the series connection group 212 are same as each other. In this embodiment, when the series circuit 210 is in a turned-on state, the series connection groups 211 and 212 are both turned on. As a result, the transistors T1_1 to T4_1 and T1_2 to T4_2 are all turned on. When the series circuit 210 is in a turned-off state, the transistors T1_1 to T4_1 and T1_2 to T4_2 are all turned off.

In this embodiment, the switch state of the series connection group 211 and the switch state of the series connection group 212 may be controlled by a control circuit 220. The control circuit 220 is coupled to the control node NDC1 and the control node NDC2. The control circuit 220 provides a control signal SC1 to the control node NDC1, and provides a control signal SC2 to the control node NDC2. For example, the control circuit 220 includes control signal generators 221 and 222. The control signal generator 221 is coupled to the control node NDC1. The control signal generator 222 is coupled to the control node NDC2. The control signal generator 221 generates the control signal SC1, and provides the control signal SC1 to the control node NDC1. The control signal generator 222 generates the control signal SC2, and provides the control signal SC2 to the control node NDC2. In this embodiment, the voltage of the control signal SC1 and the voltage of the control signal SC2 are both higher than the thresholds of the transistors T1_1 to T4_1 and T1_2 to T4_2.

In this embodiment, the control circuit 220 may be disposed in the radio frequency switch circuit 100 as shown in FIG. 2. In some embodiments, the control circuit 220 may be an external control circuit connected to the radio frequency switch circuit 100. For example, the external control circuit may be a bias circuit.

In this embodiment, when an ESD event occurs, the voltage at the control node NDC1 is different from the voltage at the control node NDC2. For example, an ESD event is used to test ESD withstandability of the radio frequency switch circuit 100. When an ESD event occurs, the control circuit 220 is in a floating state. As a result, the control signals SC1 and SC2 are also in a floating state. At this time, ESD enters the common node PC2 from a transmitting terminal TP2. An ESD voltage VESD is transmitted to the control terminal of the transistor T1_1 through the parasitic capacitive coupling of the transistor T1_1. In addition, the ESD voltage VESD is also transmitted to the control terminals of the transistors T2_1 to T4_1 through the control node NDC1. As a result, the voltage at the control node NDC1 and voltages VG1 to VG4 at the control terminals of the transistors T1_1 to T4_1 are substantially equal to the ESD voltage VESD. In this embodiment, a voltage VS4 at the second terminal of the transistor T4_1 is transmitted to the control terminal of the transistor T1_2 through the parasitic capacitive coupling of the transistor T1_2. As a result, the voltage at the control node NDC2 and voltages VG5 to VG8 at the control terminals of the transistors T1_2 to T4_2 are substantially equal to the voltage VS4.

Taking this embodiment as an example, based on the voltage division operation of the transistors T1_1 to T4_1 and T1_2 to T4_2 on the ESD voltage VESD, the voltage VS4 is substantially equal to the intermediate voltage of ESD. The intermediate voltage of ESD is equal to a half of the ESD voltage VESD. The intermediate voltage of ESD is transmitted to the control terminal of the transistor T1_2 through the parasitic capacitive coupling of the transistor T1_2. As a result, the voltage at the control node NDC2 and the voltages VG5 to VG8 at the control terminals of the transistors T1_2 to T4_2 are substantially equal to the intermediate voltage of ESD. As can be known, when an ESD event occurs, the voltage at the control node NDC1 is different from the voltage at the control node NDC2.

Taking providing the ESD voltage VESD with an ESD energy as an example, the ESD voltage VESD is equal to 100 V. The voltages VG1 to VG4 at the control terminals of the transistors T1_1 to T4_1 are equal to 100 V. The voltage at the first terminal of the transistor T1_1 is equal to 100 V. A voltage VS1 at the second terminal of the transistor T1_1 is equal to 87.5 V. As a result, the switching voltage of the transistor T1_1 (i.e., VGS1=VG1−VS1) is equal to 12.5 V. A voltage VS2 at the second terminal of the transistor T2_1 is equal to 75 V. As a result, the switching voltage of the transistor T2_1 (i.e., VGS2=VG2−VS2) is equal to 25 V. A voltage VS3 at the second terminal of the transistor T3_1 is equal to 62.5 V. As a result, the switching voltage of the transistor T3_1 (i.e., VGS3=VG3−VS3) is equal to 37.5 V. The voltage VS4 at the second terminal of the transistor T4_1 is equal to 50 V. As a result, the switching voltage of the transistor T4_1 (i.e., VGS4=VG4−VS4) is equal to 50 V.

The voltages VG5 to VG8 at the control terminals of the transistors T1_2 to T4_2 are equal to 50 V. A voltage VS5 at the second terminal of the transistor T1_2 is equal to 37.5 V. As a result, the switching voltage of the transistor T1_2 (i.e., VGS5=VG5−VS5) is equal to 12.5 V. A voltage VS6 at the second terminal of the transistor T2_2 is equal to 25 V. As a result, the switching voltage (i.e., VGS6=VG6−VS6) of the transistor T2_2 is equal to 25 V. A voltage VS7 at the second terminal of the transistor T3_2 is equal to 12.5 V. As a result, the switching voltage (i.e., VGS7=VG7−VS7) of the transistor T3_2 is equal to 37.5 V. A voltage VS8 at the second terminal of the transistor T4_2 is equal to 0 V. As a result, the switching voltage (i.e., VGS8=VG8−VS8) of the transistor T4_2 is equal to 50 V.

It should be noted that when an ESD event occurs, the switching voltages of the transistors T1_1 to T4_1 and T1_2 to T4_2 range from 12.5 V to 50 V. Compared with the series circuit 10 as in FIG. 1, the switching voltages of the transistors T1_1 to T4_1 and T1_2 to T4_2 in this embodiment are relatively uniform. The transistors T1_1 to T4_1 and T1_2 to T4_2 can perform the same switching operation in response to ESD. As a result, the series circuit 210 can improve the capability of dissipating ESD.

In this embodiment, the number of transistors T1_1 to T4_1 of the series connection group 211 is equal to the number of transistors T1_2 to T4_2 of the series connection group 212. In this embodiment, the number of transistors T1_1 to T4_1 of the series connection group 211 and the number of transistors T1_2 to T4_2 of the series connection group 212 are each 4 as an example. Nonetheless, the disclosure is not limited thereto. In some embodiments, the number of transistors in the series connection group 211 may be close to or equal to the number of transistors in the series connection group 212. A number difference between the number of transistors in the series connection group 211 and the number of transistors in the series connection group 212 is less than 20% of the number of transistors in the series connection group 211. For example, if the number of transistors in the series connection group 211 is equal to "5", the number of transistors in the series connection group 212 is equal to "4", "5", or "6".

To ensure a relatively concentrated range of the switching voltage ranges of the transistors in the series connection group 211 and the transistors in the series connection group 212 when an ESD event occurs, the number of transistors in the series connection group 211 and the number of transistors in the series connection group 212 are both less than "8".

In this embodiment, the series circuit 210 further includes choke impedance elements RG1_1 to RG4_1 and RG1_2 to RG4_2. The choke impedance elements RG1_1 to RG4_1 are each coupled between the control terminal of a corresponding one of the transistors T1_1 to T4_1 and the control node NDC1. For example, the choke impedance element RG1_1 is coupled between the transistor T1_1 and the control node NDC1, the choke impedance element RG2_1 is coupled between the transistor T2_1 and the control node NDC1, and so on. The choke impedance elements RG1_2 to RG4_2 are each coupled between the control terminal of a corresponding one of the transistors T1_2 to T4_2 and the control node NDC2. For example, the choke impedance element RG1_2 is coupled between the transistor T1_2 and the control node NDC2, the choke impedance element RG2_2 is coupled between the transistor T2_2 and the control node NDC2, and so on.

In this embodiment, the choke impedance elements RG1_1 to RG4_1 and RG1_2 to RG4_2 may each be a resistor. In some embodiments, the choke impedance elements RG1_1 to RG4_1 and RG1_2 to RG4_2 may each be an inductor or a capacitor.

For ease of description, two series connection groups 211 and 212 are taken as an example for the series circuit 210. Nonetheless, the disclosure is not limited to the number of series connection groups of this embodiment. The number of series connection groups of the series circuit 210 of the disclosure may be a plural number.

Figure 4:
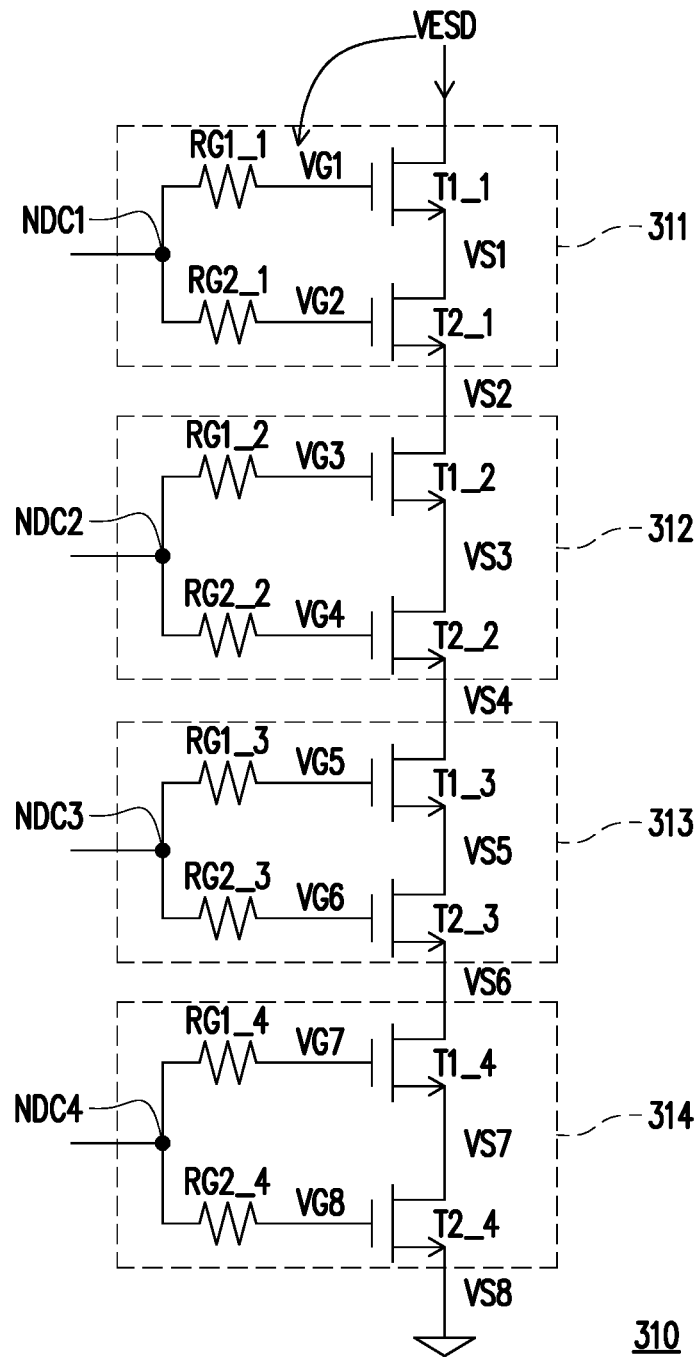
FIG. 4 is a schematic diagram of a series circuit according to an embodiment of the disclosure.

With reference to FIG. 4, FIG. 4 is a schematic diagram of a series circuit according to an embodiment of the disclosure. In this embodiment, a series circuit 310 is taken to implement one of the series circuits 110_1 to 110_4 as shown in FIG. 2, for example. Taking this embodiment as an example, the first terminal of the series circuit 310 is coupled to a common node PC2. The second terminal of the series circuit 310 is coupled to a reference voltage end.

In this embodiment, the series circuit 310 includes series connection groups 311 to 314. The series connection groups 311 to 314 are coupled in series to each other. The series connection group 311 includes transistors T1_1 and T2_1. The transistors T1_1 and T2_1 are coupled in series to each other. Control terminals of the transistors T1_1 and T2_1 are both coupled to a control node NDC1. The series connection group 312 includes transistors T1_2 and T2_2. The transistors T1_2 and T2_2 are coupled in series to each other. Control terminals of the transistors T1_2 and T2_2 are both coupled to a control node NDC2. The series connection group 313 includes transistors T1_3 and T2_3. The transistors T1_3 and T2_3 are coupled in series to each other. Control terminals of the transistors T1_3 and T2_3 are both coupled to a control node NDC3. The series connection group 314 includes transistors T1_4 and T2_4. The transistors T1_4 and T2_4 are coupled in series to each other. Control terminals of the transistors T1_4 and T2_4 are both coupled to a control node NDC4.

In this embodiment, the transistors T1_1, T2_1, T1_2, T2_2, T1_3, T2_3, T1_4, and T2_4 are implemented by N-type transistors. The transistors T1_1, T2_1, T1_2, T2_2, T1_3, T2_3, T1_4, and T2_4 are N-type MOSFETs, for example. The transistors T1_1, T2_1, T1_2, T2_2, T1_3, T2_3, T1_4, and T2_4 have the same design size (for example, the same channel width to length ratio). As a result, the series connection groups 311 to 314 have the same design size.

In a normal operation state, switch states of the series connection groups 311 to 314 are same as each other. In this embodiment, when the series circuit 310 is in a turned-on state, the series connection groups 311 to 314 are all turned on. When the series circuit 310 is in a turned-off state, all the series connection groups 311 to 314 are turned off.

In this embodiment, when an ESD event occurs, the voltages at the control nodes NDC1 to NDC4 are different from each other. For example, when an ESD event occurs, an ESD voltage VESD is transmitted to the control terminal of the transistor T1_1 through capacitive coupling. In addition, the ESD voltage VESD is also transmitted to the control terminal of the transistor T2_1 through the control node NDC1. As a result, the voltage at the control node NDC1 and voltages VG1 and VG2 at the control terminals of the transistors T1_1 and T2_1 are substantially equal to the ESD voltage VESD. Based on the voltage division operation of the transistors T1_1 to T4_1 and T1_2 to T4_2 on the ESD voltage VESD, the voltage at the control node NDC2 and voltages VG3 and VG4 at the control terminals of the transistors T1_2 and T2_2 are substantially equal to 75% of the ESD voltage VESD. The voltage at the control node NDC3 and voltages VG5 and VG6 at the control terminals of the transistors T1_3 and T2_3 are substantially equal to 50% of the ESD voltage VESD. In addition, the voltage at the control node NDC4 and voltages VG7 and VG8 at the control terminals of the transistors T1_4 and T2_4 are substantially equal to 25% of the ESD voltage VESD.

For example, the ESD voltage VESD is equal to 100 V. The voltages VG1 and VG2 at the control terminals of the transistors T1_2 and T2_2 are equal to 100 V. A voltage VS1 at the second terminal of the transistor T1_1 is equal to 87.5 V. As a result, the switching voltage of the transistor T1_1 (i.e., VGS1=VG1−VS1) is equal to 12.5 V. A voltage VS2 at the second terminal of the transistor T2_1 is equal to 75 V. As a result, the switching voltage of the transistor T2_1 (i.e., VGS2=VG2−VS2) is equal to 25 V.

The voltages VG3 and VG4 at the control terminals of the transistors T1_2 and T2_2 are equal to 75 V. A voltage VS3 at the second terminal of the transistor T1_2 is equal to 62.5 V. As a result, the switching voltage of the transistor T1_2 (i.e., VGS3=VG3−VS3) is equal to 12.5 V. A voltage VS4 at the second terminal of the transistor T2_2 is equal to 50 V. As a result, the switching voltage (i.e., VGS4=VG4−VS4) of the transistor T2_2 is equal to 25 V.

The voltages VG5 and VG6 at the control terminals of the transistors T1_3 and T2_3 are equal to 50 V. A voltage VS5 at the second terminal of the transistor T1_3 is equal to 37.5 V. As a result, the switching voltage of the transistor T1_3 (i.e., VGS5=VG5−VS5) is equal to 12.5 V. A voltage VS6 at the second terminal of the transistor T2_3 is equal to 25 V. As a result, the switching voltage (i.e., VGS6=VG6−VS6) of the transistor T2_3 is equal to 25 V.

The voltages VG7 and VG8 at the control terminals of the transistors T1_4 and T2_4 are equal to 25 V. A voltage VS7 at the second terminal of the transistor T1_4 is equal to 12.5 V. As a result, the switching voltage (i.e., VGS7=VG7−VS7) of the transistor T1_4 is equal to 12.5 V. A voltage VS8 at the second terminal of the transistor T2_4 is equal to 0 V. As a result, the switching voltage (i.e., VGS8=VG8−VS8) of the transistor T2_4 is equal to 25 V.

It should be noted that when an ESD event occurs, the switching voltages of the transistors T1_1, T2_1, T1_2, T2_2, T1_3, T2_3, T1_4, and T2_4 range from 12.5 V to 25 V. Compared with the series circuit 10 as in FIG. 1, the plurality of switching voltages in this embodiment are relatively uniform. The transistors T1_1, T2_1, T1_2, T2_2, T1_3, T2_3, T1_4, and T2_4 can perform the same switching operation in response to the voltage transient changes of ESD. As a result, the series circuit 310 can improve the capability of dissipating ESD.

Figure 5:
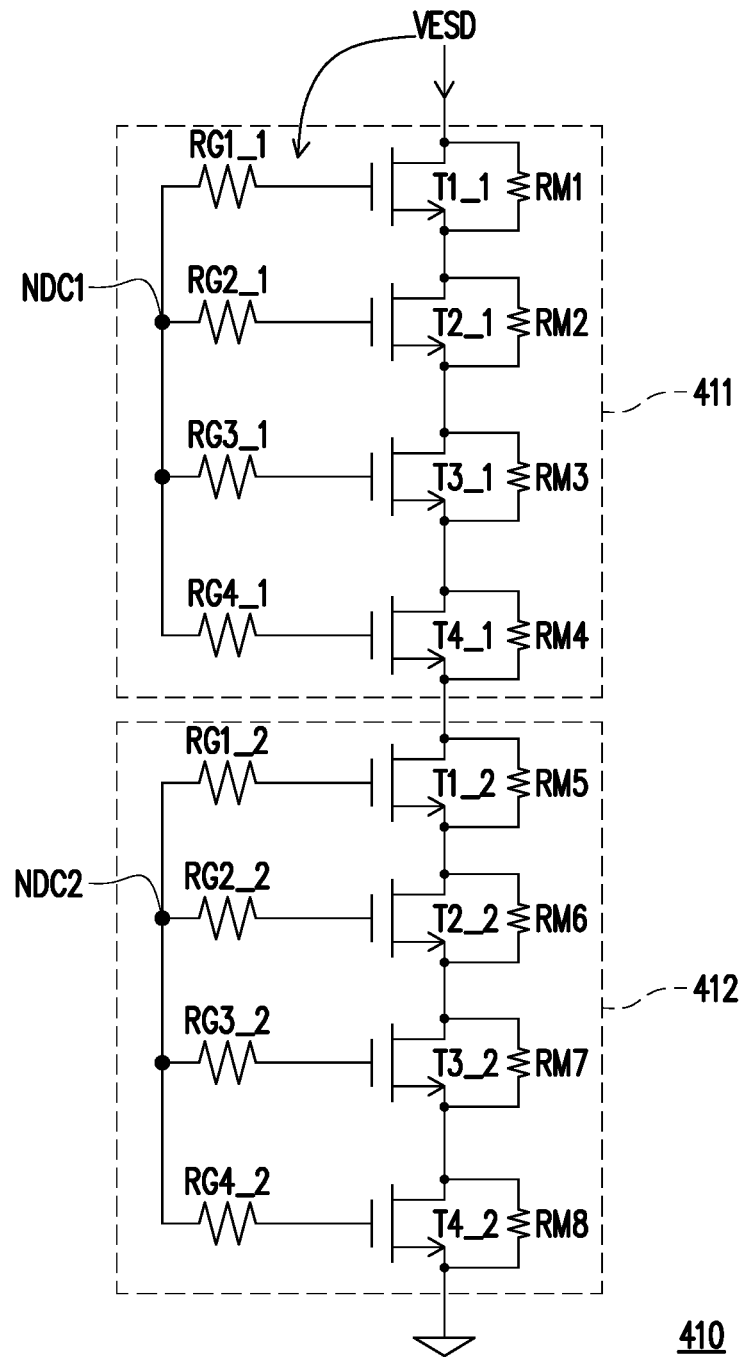
FIG. 5 is a schematic diagram of a series circuit according to an embodiment of the disclosure.

With reference to FIG. 5, FIG. 5 is a schematic diagram of a series circuit according to an embodiment of the disclosure. In this embodiment, a series circuit 410 is taken to implement one of the series circuits 110_1 to 110_4 as shown in FIG. 2, for example. In this embodiment, the series circuit 410 includes series connection groups 411 and 412, choke impedance elements RG1_1 to RG4_1 and RG1_2 to RG4_2, and matching resistors RM1 to RM8. The series connection groups 411 and 412 are coupled in series to each other. The series connection group 411 includes transistors T1_1 to T4_1. The transistors T1_1 to T4_1 are coupled in series to each other. The series connection group 412 includes transistors T1_2 to T4_2. The transistors T1_2 to T4_2 are coupled in series to each other. Control terminals of the transistors T1_1 to T4_1 are all coupled to a control node NDC1. Control terminals of the transistors T1_2 to T4_2 are all coupled to a control node NDC2.

In this embodiment, the matching resistors RM1 to RM4 are each coupled between the first terminal and the second terminal of a corresponding one of the transistors T1_1 to T4_1. For example, the matching resistor RM1 is coupled between the first terminal and the second terminal of the transistor T1_1, the matching resistor RM2 is coupled between the first terminal and the second terminal of the transistor T2_1, and so on. The matching resistors RM5 to RM8 are each coupled between the first terminal and the second terminal of a corresponding one of the transistors T1_2 to T4_2. For example, the matching resistor RM5 is coupled between the first terminal and the second terminal of the transistor T1_2, the matching resistor RM6 is coupled between the first terminal and the second terminal of the transistor T2_2, and so on. In other words, the matching resistors RM1 to RM8 are coupled in parallel to the corresponding ones of the transistors T1_1 to T4_1 and T1_2 to T4_2 in a one-to-one correspondence.

In this embodiment, when an ESD event occurs, teachings on the operation mode of the series circuit 410 may be sufficiently obtained from the embodiment of FIG. 3, and is thus not repeatedly described here. The transistors T1_1 to T4_1 and T1_2 to T4_2 can perform the same switching operation in response to the voltage transient changes of ESD.

In this embodiment, the series resistance of the matching resistors RM1 to RM4 is substantially the same as the series resistance of the matching resistors RM1 to RM8. For example, the respective resistances of the matching resistors RM1 to RM8 may be designed to be substantially the same. The resistances of the matching resistors RM1 to RM8 are each 50 kiloohms (kΩ), for example. In some embodiments, the error of the respective resistances of the matching resistors RM1 to RM8 may be regulated. For example, the error of the respective resistances of the matching resistors RM1 to RM8 is regulated to be less than 20% (e.g., 50 kΩ±10%).

When an ESD event occurs, an ESD voltage VESD may be insufficient to turn on the transistors T1_1 to T4_1 and T1_2 to T4_2. As a result, in the case where the transistors T1_1 to T4_1 and T1_2 to T4_2 are not turned on, the matching resistors RM1 to RM8 may perform a voltage division operation on the ESD voltage VESD. In addition, in the case where the ESD voltage VESD is insufficient, the matching resistors RM1 to RM8 can consume the electric power of ESD.

In a normal operation state, the transistors T1_1 to T4_1 and T1_2 to T4_2 are all turned off. As a result, the series circuit 410 utilizes the resistances of the matching resistors RM1 to RM8 to provide a matching impedance. Comparatively, when the series connection groups 411 and 412 are turned on, the transistors T1_1 to T4_1 and T1_2 to T4_2 are all turned on. The matching resistors RM1 to RM8 are bypassed. As a result, the series circuit 410 has a low impedance.

In summary of the foregoing, the series circuit includes the first series connection group and the second series connection group. The control terminals of the plurality of first transistors of the first series connection group are all coupled to the first control node. The control terminals of the plurality of second transistors of the second series connection group are all coupled to the second control node. When an ESD event occurs, the voltage at the first control node is different from the voltage at the second control node. When an ESD event occurs, the first series connection group and the second series connection group commonly form a dissipating path for discharge, and the switching voltages of the plurality of first transistors and the plurality of second transistors are relatively close. The plurality of first transistors and the plurality of second transistors can perform the same switching operation in response to ESD. In this way, the radio frequency switch circuit can improve the capability of dissipating ESD.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A radio frequency switch circuit comprising:
   a series circuit comprising:
      a first series connection group comprising a plurality of first transistors; and
      a second series connection group comprising a plurality of second transistors,
   wherein control terminals of the first transistors are all coupled to a first control node,
   wherein control terminals of the second transistors are all coupled to a second control node,
   wherein when an electrostatic discharge event occurs, a voltage at the first control node is different from a voltage at the second control node, and
   wherein in a normal operation state, a switch state of the first series connection group and a switch state of the second series connection group are the same as each other.

2. The radio frequency switch circuit according to claim 1, further comprising:
   a first transmitting terminal coupled to a first common node; and
   a second transmitting terminal coupled to a second common node, wherein the second transmitting terminal forms a first transmission path with the first transmitting terminal through the second common node and the first common node,
   wherein a first terminal of the series circuit is coupled to the second common node.

3. The radio frequency switch circuit according to claim 2, wherein a second terminal of the series circuit is coupled to the first common node.

4. The radio frequency switch circuit according to claim 2, wherein a second terminal of the series circuit is coupled to a reference voltage end.

5. The radio frequency switch circuit according to claim 4, wherein a voltage at the reference voltage end is equal to 0 V.

6. The radio frequency switch circuit according to claim 1, wherein a number difference between the number of the first transistors and the number of the second transistors is less than 20% of the number of the first transistors.

7. The radio frequency switch circuit according to claim 1, wherein the number of the first transistors is equal to the number of the second transistors.

8. The radio frequency switch circuit according to claim 1, wherein the number of the first transistors and the number of the second transistors are both less than 8.

9. The radio frequency switch circuit according to claim 1, wherein the series circuit further comprises:
a plurality of first matching resistors each coupled between a first terminal and a second terminal of a corresponding one of the first transistors; and
a plurality of second matching resistors each coupled between a first terminal and a second terminal of a corresponding one of the second transistors.

10. The radio frequency switch circuit according to claim 9, wherein a series resistance of the first matching resistors is the same as a series resistance of the second matching resistors.

11. The radio frequency switch circuit according to claim 9, wherein an error of resistances of the first matching resistors and an error of resistances of the second matching resistors are less than 20%.

12. The radio frequency switch circuit according to claim 1, wherein the series circuit further comprises:
a plurality of first choke impedance elements each coupled between the control terminal of a corresponding one of the first transistors and the first control node; and
a plurality of second choke impedance elements each coupled between the control terminal of a corresponding one of the second transistors and the second control node.

13. The radio frequency switch circuit according to claim 1, wherein:
when the first series connection group is in a turned-off state, the first transistors are turned off, and
when the second series connection group is in a turned-off state, the second transistors are turned off.

14. The radio frequency switch circuit according to claim 1, wherein when the series circuit is turned on, the series circuit has a low impedance.

15. The radio frequency switch circuit according to claim 1, wherein the first series connection group and the second series connection group have the same design size.

16. The radio frequency switch circuit according to claim 1, wherein:
in the normal operation state, the switch state of the first series connection group and the switch state of the second series connection group are controlled by a control circuit,
the control circuit comprises a first control signal generator and a second control signal generator respectively coupled to the first control node and the second control node, and
the first control signal generator provides a first control signal to the first control node, and the second control signal generator provides a second control signal to the second control node.

17. A radio frequency switch circuit comprising:
a radio frequency input terminal;
a radio frequency output terminal having a first transmission path with the radio frequency input terminal; and
a series circuit, wherein a first terminal of the series circuit is coupled to the first transmission path, and a second terminal of the series circuit is coupled to a reference voltage end, wherein the series circuit comprises:
a first series connection group comprising a plurality of first transistors; and
a second series connection group comprising a plurality of second transistors,
wherein a terminal of the second series connection group is coupled to the reference voltage end,
wherein in a normal operation state, a switch state of the first series connection group and a switch state of the second series connection group are the same as each other,
wherein control terminals of the first transistors are all coupled to a first control node,
wherein control terminals of the second transistors are all coupled to a second control node, and
wherein when an electrostatic discharge event occurs, a voltage at the first control node is different from a voltage at the second control node.

18. The radio frequency switch circuit according to claim 17, wherein:
control terminals of the first transistors are all coupled to a first control node,
control terminals of the second transistors are all coupled to a second control node, and the series circuit further comprises:
a plurality of first choke impedance elements each coupled between the control terminal of a corresponding one of the first transistors and the first control node; and
a plurality of second choke impedance elements each coupled between the control terminal of a corresponding one of the second transistors and the second control node.

* * * * *